(12) United States Patent
Lee et al.

(10) Patent No.: US 10,892,435 B2
(45) Date of Patent: Jan. 12, 2021

(54) ORGANIC LIGHT EMITTING DIODE DISPLAY DEVICE

(71) Applicant: LG Display Co., Ltd., Seoul (KR)

(72) Inventors: Dongyoon Lee, Seoul (KR); Inyeong Kong, Seoul (KR); Jongsin Park, Seoul (KR)

(73) Assignee: LG Display Co., Ltd., Seoul (KR)

( * ) Notice: Subject to any disclaimer, the term of this patent is extended or adjusted under 35 U.S.C. 154(b) by 55 days.

(21) Appl. No.: 16/137,214

(22) Filed: Sep. 20, 2018

(65) Prior Publication Data

US 2019/0207140 A1 Jul. 4, 2019

(30) Foreign Application Priority Data

Dec. 29, 2017 (KR) .......................... 10-2017-0183579

(51) Int. Cl.
*H01L 51/52* (2006.01)
*H01L 27/146* (2006.01)
*H01L 27/12* (2006.01)

(52) U.S. Cl.
CPC ...... *H01L 51/5203* (2013.01); *H01L 27/1214* (2013.01); *H01L 27/1248* (2013.01); *H01L 27/14621* (2013.01); *H01L 51/5237* (2013.01)

(58) Field of Classification Search
CPC ............. H01L 51/5203; H01L 27/1214; H01L 27/1248; H01L 27/14621; H01L 51/5237
(Continued)

(56) References Cited

U.S. PATENT DOCUMENTS

2004/0125288 A1* 7/2004 Jeong ................ G02F 1/133553
349/113
2005/0266763 A1 12/2005 Kimura et al.
(Continued)

FOREIGN PATENT DOCUMENTS

CN 101727828 A 6/2010
CN 104952884 A 9/2015
(Continued)

OTHER PUBLICATIONS

China National Intellectual Property Administration, Office Action, CN Patent Application No. 2018108770084, Oct. 10, 2020, 14 pages.

*Primary Examiner* — Amare Mengistu
*Assistant Examiner* — Gloryvid Figueroa-Gibson
(74) *Attorney, Agent, or Firm* — Fenwick & West LLP

(57) ABSTRACT

An organic light-emitting diode (OLED) display device capable of improving light extraction efficiency and lifetime is disclosed. In the OLED display device, a protective layer having a convex shaped protruding pattern is arranged in a light emitting area at a central portion of a substrate, so that only the light emitting area has a selectively convex protruding shape. Accordingly, in the OLED display device, in a process of forming an organic light emitting layer, the protruding pattern can artificially offset the organic light emitting layer arranged at the central portion of the substrate being sagged, by a protective layer having a convex shaped protruding pattern. As a result, the OLED display device can improve a problem of thickness non-uniformity of the central portion and an edge portion of the substrate due to a sagging phenomenon of the organic light emitting layer.

12 Claims, 8 Drawing Sheets

(58) Field of Classification Search
USPC .......................................................... 345/76
See application file for complete search history.

(56) References Cited

U.S. PATENT DOCUMENTS

| | | | |
|---|---|---|---|
| 2016/0079334 A1* | 3/2016 | Lee | H01L 27/3276 |
| | | | 257/40 |
| 2017/0084676 A1* | 3/2017 | Jang | H01L 51/5209 |
| 2017/0092705 A1* | 3/2017 | Lim | H01L 27/322 |
| 2017/0155094 A1* | 6/2017 | Joung | H01L 51/5206 |
| 2019/0067646 A1* | 2/2019 | Ichikawa | H01L 51/50 |

FOREIGN PATENT DOCUMENTS

| | | |
|---|---|---|
| CN | 105470279 A | 4/2016 |
| CN | 106816454 A | 6/2017 |
| CN | 106920818 A | 7/2017 |
| KR | 10-2004-0103062 A | 12/2004 |
| KR | 10-2008-0061732 A | 7/2008 |
| KR | 10-2016-0141127 A | 12/2016 |

* cited by examiner (a)

(b)

ORGANIC LIGHT EMITTING DIODE DISPLAY DEVICE

CROSS-REFERENCE TO RELATED APPLICATION

This application claims priority to Republic of Korea Patent Application No. 10-2017-0183579 filed on Dec. 29, 2017 with the Korean Intellectual Property office, which is incorporated herein by reference in its entirety.

BACKGROUND

1. Field of Technology

The present disclosure relates to an OLED display device, and more particularly, to an OLED display device capable of improving light extraction efficiency and lifetime.

2. Description of the Related Art

A flat panel display device proposed to replace a cathode ray tube display device includes a liquid crystal display, a field emission display, a plasma display panel, and an organic light-emitting diode (OLED) display device.

Among them, in the OLED display device, an OLED provided in a display panel has a high luminance and a low operating voltage. In addition, since the OLED display device is a self-light emitting type that emits a light by itself, a contrast ratio is large and a realization of an ultra-thin display device is possible. In addition, a response time is several microseconds (μs), which is easy to realize a moving image, a viewing angle is not limited, and it is stable even at a low temperature.

In order to express a color in such an OLED display device, the organic light emitting layers which emit the lights of R (red), G (green), and B (blue) colors respectively or emit a white light are used. The organic light emitting layers are formed between two electrodes to form the OLED (organic light-emitting diode).

In addition, the OLED display device defines a pixel area by intersecting a data line to which a video signal is supplied, a gate line to which a driving signal is supplied, and a power supply line to supply a power to the OLED one another. At this time, a switching thin film transistor, a driving thin film transistor, a storage capacitor, and an OLED are arranged in the pixel area.

The above-mentioned OLED may have a structure in which an anode electrode (Anode), the organic light emitting layer, and a cathode electrode (cathode) are sequentially stacked.

At this time, the organic light emitting layer includes a hole injection layer (HIL), a hole transport layer (HTL), an emission layer (EML), an electron transport layer (ETL), and an electron injection layer (EIL).

In such an OLED, in an excitation process when a hole and an electron injected into the anode electrode (anode) and cathode electrode (cathode) are recombined in the EML (emission layer), an exciton is formed, and it emits a light due to an energy from the exciton. The OLED display device displays an image by electrically controlling the amount of light generated in the emission layer (EML) of the OLED.

SUMMARY

It is an object of the present disclosure to provide an organic light-emitting diode (OLED) display device capable of improving light extraction efficiency and lifetime.

For this purpose, in the OLED display device in accordance with the present disclosure, a protective layer having a convex shaped protruding pattern is arranged in a light emitting area at a central portion of a substrate, so that only a light emitting area has a selectively convex protruding shape.

Accordingly, in the OLED display device in accordance with the present disclosure, in a process of forming an organic light emitting layer in an ink-jet printing method, the protruding pattern of the protective layer can artificially offset the organic light emitting layer arranged at the central portion of the substrate being sagged, by the protective layer having the convex shaped protruding pattern and can compensate for it.

As a result, the OLED display device in accordance with the present disclosure can improve a problem of thickness non-uniformity of the central portion and an edge portion of the substrate due to a sagging phenomenon of the organic light emitting layer arranged in the light emitting area at the central portion of the substrate.

In accordance with an exemplary embodiment of the present disclosure, an OLED display device includes a substrate having a light emitting area and a non-light emitting area; a thin film transistor arranged on the substrate; a protective layer that covers the thin film transistor of the light emitting area and the non-light emitting area and has a protruding pattern arranged in the light emitting area; an overcoat layer that covers the protective layer; a first electrode that is arranged on the overcoat layer and is connected to the thin film transistor through a first contact hole to expose a part of the protective layer and the overcoat layer; an organic light emitting layer that is arranged on the first electrode; and a second electrode that is arranged on the organic light emitting layer.

At this time, in the OLED display device in accordance with an exemplary embodiment of the present disclosure, although the organic light emitting layer arranged in the light emitting area in the central portion of the substrate is sagged in a downwardly convex form, the upwardly convex shaped protruding pattern is arranged in the light emitting area. Accordingly, it can offset the thickness that the organic light emitting layer is sagged, and consequently, it is possible to uniformly secure the thickness of the organic light emitting layer arranged in the light emitting area of the central portion and the edge portion of the substrate.

Therefore, the OLED display device in accordance with the present disclosure may exhibit a maximum thickness deviation of 10A or less between the organic light emitting layers arranged at the central portion and the edge portion of the substrate, respectively.

In addition, in the OLED display device in accordance with the present disclosure, the protruding pattern is formed simultaneously with the protective layer by a selective etching process using a halftone mask when forming the protective layer. Therefore, the protective layer and the protruding pattern have an integrated structure, thereby there is no need to use a separate mask, resulting in an increase in manufacturing cost.

In the OLED display device in accordance with the present disclosure, the protective layer having the convex shaped protruding pattern is arranged in the light emitting area at the central portion of the substrate, so that only the light emitting area has the selectively convex protruding shape.

Accordingly, in the OLED display device in accordance with the present disclosure, in the process of forming the organic light emitting layer in the ink-jet printing method, the protruding pattern of the protective layer can artificially offset the organic light emitting layer arranged at the central portion of the substrate being sagged, by the protective layer having the convex shaped protruding pattern and can compensate for it.

As a result, the OLED display device in accordance with the present disclosure can improve a problem of thickness non-uniformity of the central portion and the edge portion of the substrate due to a sagging phenomenon of the organic light emitting layer arranged in the light emitting area at the central portion of the substrate.

That is, in the OLED display device in accordance with the present disclosure, although the organic light emitting layer arranged in the light emitting area of the central portion of the substrate is sagged in a downwardly convex form, the upwardly convex shaped protruding pattern is arranged in the light emitting area. Accordingly, it can offset the thickness that the organic light emitting layer is sagged, and consequently, it is possible to uniformly secure the thickness of the organic light emitting layer arranged in the light emitting area of the central portion and the edge portion of the substrate.

Therefore, since the OLED display device in accordance with the present disclosure exhibits a maximum thickness deviation of 10A or less between the organic light emitting layers arranged at the central portion and the edge portion of the substrate, and has an excellent thickness uniformity, there is no concern that an operating voltage increases, thereby improving light extraction efficiency and lifetime.

In addition, in the OLED display device in accordance with the present disclosure, the protruding pattern is formed simultaneously with the protective layer by a selective etching process using a halftone mask when forming the protective layer. Therefore, the protective layer and the protruding pattern have the integrated structure, resulting in that there is no need to use a separate mask, and an increase in manufacturing cost.

DETAILED DESCRIPTION

Figure 1:
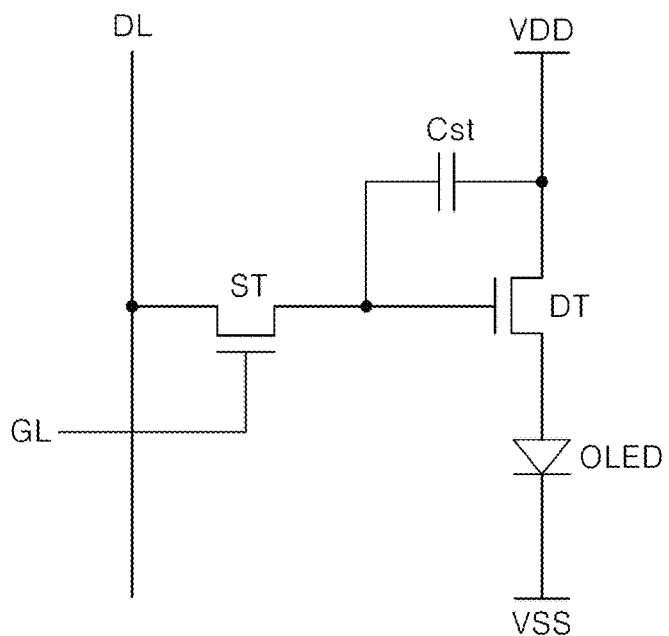
FIG. 1 is a circuit diagram showing a unit pixel of an organic light-emitting diode (OLED) display device in accordance with a first embodiment of the present disclosure.

The above-mentioned objects, features, and advantages of the present disclosure will be described in detail with reference to the accompanying drawings, and accordingly, the technical idea of the present disclosure can be easily performed by those skilled in the art. In describing the present disclosure, when it is determined that the detailed description of the known technique related to the present disclosure may unnecessarily obscure the gist of the preset disclosure, a detailed description will be omitted. Hereinafter, the preferred embodiments according to the present disclosure will be described in detail with reference to the accompanying drawings. In the drawings, the same reference numerals are used to indicate the same or similar components.

Hereinafter, an organic light-emitting diode (OLED) display device in accordance with the preferred embodiments of the present disclosure will be described in detail with reference to the accompanying drawings.

FIG. 1 is a circuit diagram showing a unit pixel of an OLED display device in accordance with a first embodiment of the present disclosure.

As shown in FIG. 1, the OLED display device in accordance with the first embodiment of the present disclosure includes a switching transistor ST, a driving transistor DT connected to the switching transistor ST, and an organic light-emitting diode (OLED) connected to the driving transistor DT.

The switching transistor ST is arranged at a portion intersecting a gate line GL arranged in a first direction and a data line DL arranged in a second direction intersecting the first direction. This switching transistor ST serves to select a pixel. The switching transistor ST includes a gate electrode which is protruded from the gate line GL, a semiconductor layer arranged with overlapped with the gate electrode, and a source electrode and a drain electrode that are protruded from the data line DL.

The driving transistor DT serves to drive an organic light emitting diode (OLED) of a pixel selected by a switching transistor ST. The driving transistor DT includes a gate electrode connected to a drain electrode of the switching transistor ST through a drain contact hole, a semiconductor layer arranged with overlapped with the gate electrode, a source electrode connected to a driving current line VDD, and a drain electrode arranged with spaced apart from the source electrode.

Figure 2:
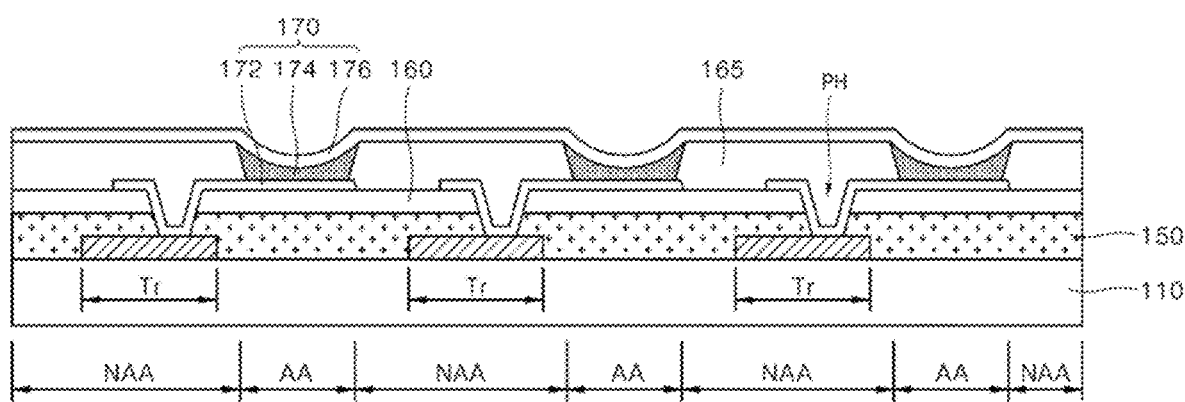
FIG. 2 is a schematic view showing a state in which an organic light emitting diode is manufactured by an ink-jet printing method in a light emitting area on a substrate, according to an embodiment of the present disclosure.

Meanwhile, FIG. 2 is a schematic view showing a state in which an OLED is manufactured by an ink-jet printing method on a light emitting area on a substrate.

As shown in FIG. 2, a thin film transistor Tr is arranged on a non-light emitting area NAA on the substrate 110, and a protection film 150 is arranged on the thin film transistor Tr, and an overcoat layer 150 is formed on the protection film 150.

At this time, the substrate 110 may be made of a polymer resin material such as polyimide to realize a flexible property. The thin film transistor Tr may include a switching transistor (ST in FIG. 1) and a driving transistor (DT in FIG. 1).

The protective layer 150 covers the thin film transistor Tr in a light emitting area AA and a non-light emitting area NAA.

The overcoat layer 160 serves to block moisture and air penetrating from a lower portion of the substrate 110 in addition to flattening a surface of the substrate 110. For this purpose, the overcoat layer 160 may be formed of an organic material including photo acrylic (PAC).

An OLED 170 is arranged in a light emitting area AA on the overcoat layer 160. This OLED 170 has a first electrode 172, an organic light emitting layer 174, and a second electrode 176.

The first electrode 172 is electrically connected to the thin film transistor Tr through a pixel contact hole PH to expose a part of the protective layer 150 and the overcoat layer 160. As the first electrode 172, a transparent conductive material such as ITO may be used.

The organic light emitting layer 174 is arranged on the first electrode 172. At this time, the organic light emitting layer 174 of the first embodiment of the present disclosure is manufactured at a low temperature and a low cost by forming it by using the ink-jet printing method instead of a vapor evaporation method. At this time, the organic light emitting layer 174 may be arranged corresponding to the light emitting area AA on the substrate 110, but is not limited thereto.

The organic light emitting layer 174 may be formed of an organic light emitting material that outputs a white light. For example, the organic light emitting layer 174 may be formed of a blue organic light emitting layer, a red organic light emitting layer, and a green organic light emitting layer, and it may be formed of a tandem structure including the blue light emitting layer and a yellow-green light emitting layer. However, the organic light emitting layer of the present disclosure is not limited to the above structure, but various structures may be applied.

In addition, although not shown in the drawings, the OLED 170 may further include an electron injection layer (EIL) and a hole injection layer (HIL) to inject an electron and a hole into the organic light emitting layer 174, an electron transport layer (ETL) and a hole transport layer (HTL) to transport the injected electron and hole into an organic light emitting layer, respectively, and an emission layer (EML) that is arranged between the HTL and the ETL.

The organic light emitting layer 174 is a material that emits a light in a visible light area by transporting the hole and the electron from the HTL and the ETL, respectively, and combining them, and a material having good quantum efficiency for a fluorescence or a phosphorescence is preferable. As the organic materials, for example, 8-hydroxyquinoline aluminum complex (Alq3), a carbazol-based compound, a dimerized styryl compound, BAlq, a 10-hydroxybenzo quinoline-metal compound, a benzoxazole, benzthiazol, and benzimidazole-based compound, poly-P-phenylenevinylene (PPV) may be used, but is not limited thereto.

The second electrode 176 is arranged on the organic light emitting layer 171. The second electrode 176 may be formed of a metal such as Ca, Ba, Mg, Al, or Ag, or an alloy thereof.

At this time, when the first electrode 172 is an anode of the OLED 170, and the second electrode 176 is a cathode, and a voltage is applied to the first electrode 172 and the second electrode 176, an electron is injected from the second electrode 176 into the organic light emitting layer 174, and a hole is injected from the first electrode 172 into the organic light emitting layer 174 to form an exciton in the organic light emitting layer 174. As the exciton is decayed, a light corresponding to an energy difference between a Lowest unoccupied molecular orbital (LUMO) and a highest occupied molecular orbital (HOMO) of the organic light emitting layer 174 is generated to emit a light.

The OLED display device in accordance with the first embodiment of the present disclosure forms the organic light emitting layer 174 including the HIL, the HTL, the EML, the ETL, and the EIL by using an ink-jet printing method, so that it is possible to manufacture a flexible OLED display device at a low temperature and a low cost.

For this purpose, when forming the organic light emitting layer 174 including the HIL, the HTL, the EML, the ETL, and the EIL by using the ink-jet printing method, the OLED display device in accordance with the first embodiment of the present disclosure, it is manufactured by printing each material in air, vacuum drying, and then, annealing in air or a nitrogen atmosphere.

During the vacuum drying, although it is dried through a wet film drying process in the nitrogen atmosphere, a temperature uniformity after drying is low, and a phenomenon that the organic light emitting layer 174 arranged in the light emitting area of the central portion of the substrate is sagged in a downwardly convex form has been generated.

Accordingly, there has been a problem that a thickness of the organic light emitting layer 174 arranged in the light emitting area AA of the central portion of the substrate 110 is lowered compared to the organic light emitting layer 174 arranged in the light emitting area AA of the edge of the substrate 110.

In general, in a case in which the organic light emitting layer 174 is formed by using the vapor evaporation method, it is possible to uniformly control the thickness of the organic light emitting layer 174 arranged in the light emitting area AA of the central portion and the edge portion of the substrate 110, respectively.

However, when the organic light emitting layer 174 is formed by using the ink-jet printing method, there is a phenomenon that the organic light emitting layer 174 arranged in the light emitting area AA of the central portion of the substrate 110 is sagged in a downwardly convex form since the temperature uniformity is low after drying. Thereby, a thickness non-uniformity is generated due to the difference in thickness of the organic light emitting layer 174 arranged in the light emitting area AA of the central portion and the edge portion of the substrate 110, respectively.

Figure 3:
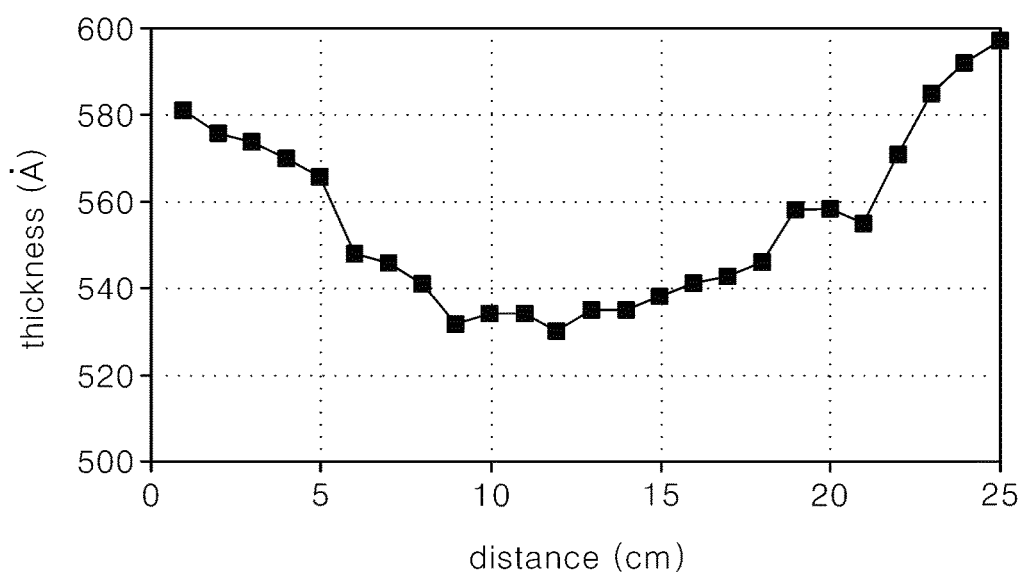
FIG. 3 is a graph showing a result of thickness measurement depending on a distance of an OLED of an OLED display device in accordance with a first embodiment of the present disclosure.

FIG. 3 is a graph showing a result of thickness measurement depending on a distance of an OLED of an OLED display in accordance with a first embodiment of the present disclosure.

As shown in FIG. 3, in the OLED display device in accordance with the first embodiment of the present disclosure, it can be confirmed that a thickness deviation between the organic light emitting layer arranged in a central portion of a substrate and the organic light emitting layer arranged in an edge portion of a substrate is generated, resulting from a forming of an organic light emitting layer by using an ink-jet printing method.

At this time, the maximum deviation between the organic light emitting layers arranged at the central portion and the edge portion of the substrate, respectively, was measured to be about 67 Å.

As described above, when a thickness non-uniformity of the organic light emitting layer arranged in the light emitting area of the central portion and the edge portion of the substrate respectively is generated, a light extraction efficiency of an OLED is lowered and a driving voltage is increased, which eventually works as a factor that shortens lifetime of the OLED display device.

In order to solve this, in an OLED display device in accordance with a second embodiment of the present disclosure, a protective layer having a convex shaped protruding pattern arranged in a light emitting area at a central portion of a substrate is arranged, so that only a light emitting area is designed to have a selectively convex protruding shape.

Accordingly, in the OLED display device in accordance with the second embodiment of the present disclosure, in a process of forming an organic light emitting layer in an ink-jet printing method, the protruding pattern of the protective layer can artificially offset the organic light emitting layer arranged at a central portion of the substrate being sagged, by the protective layer having a convex shaped protruding pattern and can compensate for it. Therefore, it can improve a problem of thickness non-uniformity of the central portion and the edge portion of the substrate due to a sagging phenomenon of the organic light emitting layer arranged in the light emitting area disposed at the central portion of the substrate.

This will be described in more detail with reference to the accompanying drawings.

Figure 4:
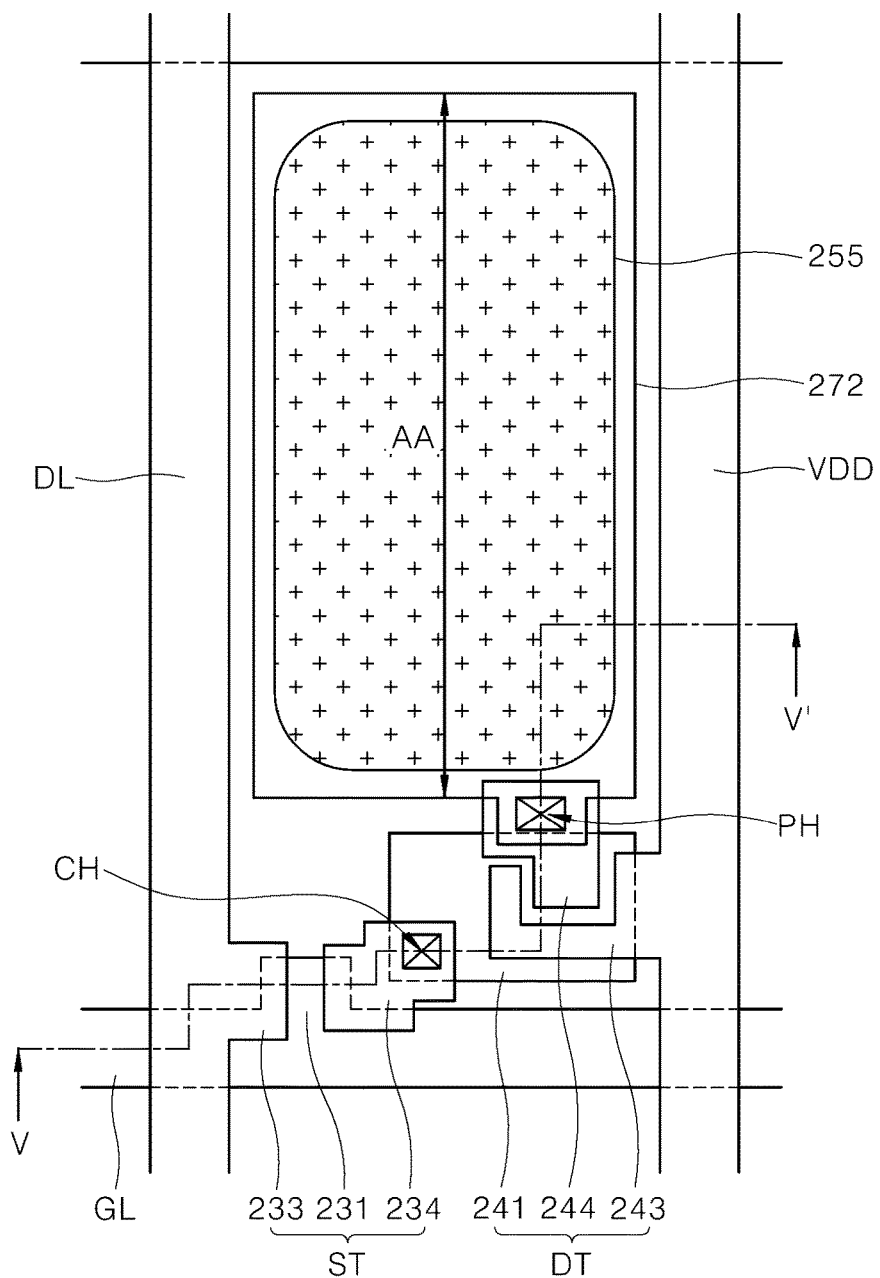
FIG. 4 is a plan view showing an OLED display device in accordance with a second embodiment of the present disclosure.
Figure 5:
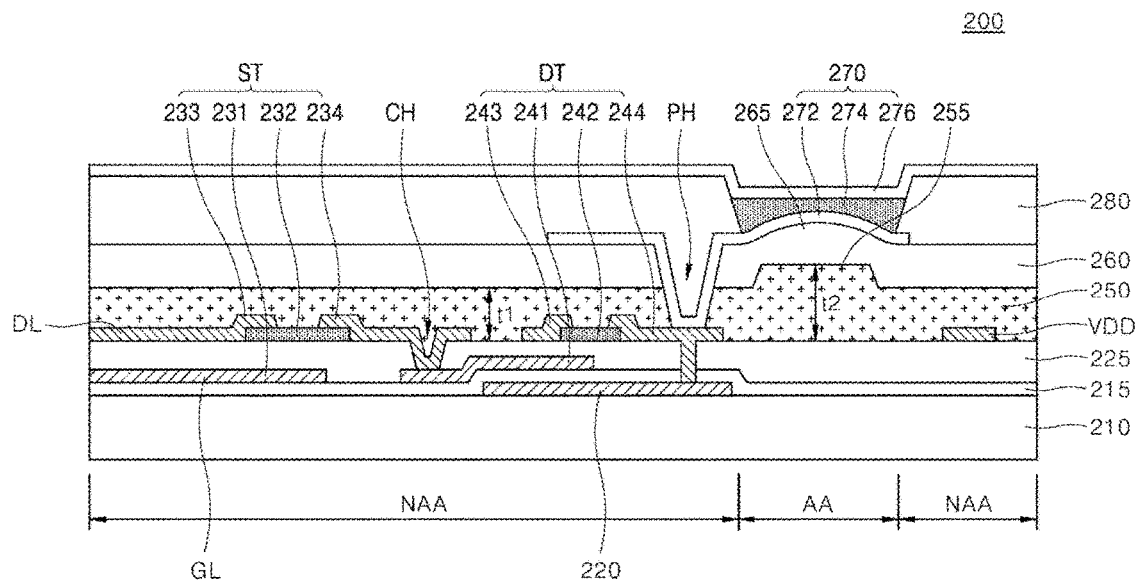
FIG. 5 is a cross-sectional view taken along line V-V' in FIG. 4, according to an embodiment of the present disclosure.

FIG. 4 is a plan view showing an OLED display device in accordance with a second embodiment of the present disclosure, and FIG. 5 is a cross-sectional view showing taken along line V-V' of FIG. 4.

Referring to FIGS. 4 and 5, the OLED display device 200 in accordance with the second embodiment of the present disclosure includes a substrate 210, a thin film transistor ST and DT, a protective layer 250, an overcoat layer 260, and an OLED 270.

The substrate 210 has a light emitting area AA to emit a light and a non-light emitting area NAA not to emit a light. At this time, the substrate 210 may be made of a polymer resin material such as polyimide to realize a flexible property. At this time, a buffer layer 215 may be arranged on the substrate 210, and a light blocking pattern 220 may be further arranged between the substrate 210 and the buffer layer 215. The light blocking pattern 220 is arranged so as to be overlapped with a semiconductor layer 242 of the thin film transistors ST and DT, in particular the driving transistor DT to protect the semiconductor layer 242 of the driving transistor DT from a light incident from outside.

The thin film transistors ST and DT are arranged on the substrate 210. The thin film transistors ST and DT are arranged in a non-light emitting area NAA of the substrate 210 and may include the switching transistor ST and the driving transistor DT.

The switching transistor ST is arranged at an intersection portion of a gate line GL arranged in a first direction and a data line DL arranged in a second direction intersecting the first direction. This switching transistor ST functions to select a pixel. The switching transistor ST includes a gate electrode 231 that is protruded from the gate line GL and a semiconductor layer 232 arranged with overlapped with the gate electrode 231, a source electrode 233 that is protruded from the data line DL, and a drain electrode 234 arranged with spaced apart from the source electrode 233.

The driving transistor DT serves to drive the OLED 270 of the pixel selected by the switching transistor ST. The driving transistor DT includes a gate electrode 241 connected to a drain electrode 234 of the switching transistor ST through a drain contact hole CH, a semiconductor layer 242 arranged in an upper portion overlapped with the gate electrode 241, a source electrode 243 connected to a driving current line VDD, and a drain electrode 244 arranged with spaced apart from the source electrode 243.

At this time, the drain electrode 244 of the driving transistor DT is electrically connected to a first electrode 272 of the OLED 270 through a pixel contact hole PH.

The protective layer 250 covers a light emitting area AA and a thin film transistors ST and DT of a non-light emitting area NAA. The protective layer 250 may be formed of an inorganic layer such as SiOx, SiON, SiNx, or the like. In addition, the protective layer 250 may be formed of an organic layer such as PAC, and may be formed of a plurality of layers including the inorganic layer and the organic layer.

In particular, in the second embodiment of the present disclosure, the protective layer 250 has a protruding pattern 255 arranged in the light emitting area AA on the substrate 210. The protective layer 250 arranged in the light emitting area AA on the substrate 210 may have a stepped coverage structure in a step shape by the protruding pattern 255. More specifically, the protective layer 250 arranged at the non-light emitting area NAA of the substrate 210 has a first thickness t1, and the protective layer 250 arranged in the light emitting area AA of the substrate 210 has a second thickness t2 by the protruding pattern 255.

As described above, the protective layer 250 having a convex shaped protruding pattern 255 in the light emitting area AA at a central portion of a substrate 210 is arranged, so that only the light emitting area AA has the selectively convex protruding shape.

Accordingly, in the OLED display device 200 in accordance with the second embodiment of the present disclosure, in a process of forming an organic light emitting layer 274 in an ink-jet printing method, the protruding pattern 255 of the protective layer 250 can artificially offset the organic light emitting layer 274 arranged at the central portion of the substrate being sagged, by the protective layer 250 having a convex shaped protruding pattern 255 and can compensate for it. As a result, it can improve a problem of thickness non-uniformity of the central portion and the edge portion of the substrate 210 due to a sagging phenomenon of the organic light emitting layer 274 arranged in the light emitting area AA of the central portion of the substrate 210.

Accordingly, in the OLED display device 200 in accordance with the second exemplary embodiment of the present disclosure, although the organic light emitting layer 274 arranged in the light emitting area AA disposed in the central portion of the substrate 210 is sagged in a downwardly convex form, an upwardly convex shaped protruding pattern 255 is arranged in the light emitting area AA. Accordingly, it can offset the thickness that the organic light emitting layer 274 is sagged, and consequently, it is possible to uniformly secure the thickness of the organic light emitting layer 274 arranged in the light emitting area AA of the central portion and an edge portion of the substrate 210.

At this time, since the protruding pattern 255 is formed simultaneously with the protective layer 250 by a selective etching process using a halftone mask when forming the protective layer 250, it has an integrated structure with the protective layer 250. Thereby, there is no need to further use a separate mask, resulting in an increase in a manufacturing cost.

The protruding pattern 255 may have a circle shape when viewed in a plan. At this time, an example of FIG. 4 is that the protruding pattern 255 has an elliptical shape among the circle shapes. The protruding pattern 255 may be arranged to correspond to the light emitting area AA on the substrate 210 one by one, respectively. As described above, by arranging the protruding pattern 255 of the protective layer 250 so as to correspond to the light emitting area AA on the substrate 210 one by one, respectively, it becomes possible to selectively adjust only the thickness of the light emitting area AA of the central portion of the substrate 210.

The overcoat layer 260 covers the protective layer 250. The overcoat layer 260 serves to block moisture and air penetrating from a lower portion of the substrate 210 in addition to flattening a surface of the substrate 210. For this purpose, the overcoat layer 260 may be formed of an organic material including PAC (photo acrylic).

At this time, the overcoat layer 260 has the convex shaped protrusion 265 at a position corresponding to the protruding pattern 255. The protrusion 265 of the overcoat layer 260 is controlled in thickness by the protruding pattern 255 of the protective layer 250. At this time, it is preferable that the protrusion 265 of the overcoat layer 260 has a thickness of 60 Å or less. This is because, when the protrusion 265 of the overcoat layer 260 is designed to have a thickness exceeding 60 Å, an excessive thickness design may lead to a defect that is protruded in the upwardly convex shape after vacuum drying and annealing.

The OLED 270 includes the first electrode 272, the organic light emitting layer 274, and a second electrode 276.

The first electrode 272 is arranged on the overcoat layer 260 and is electrically connected to the driving transistor DT of the thin film transistor through a pixel contact hole PH to expose a part of the protective layer 250 and the overcoat layer 260. As the first electrode 272, a transparent conductive material such as ITO may be used. At this time, a bank layer 280 to expose a part of the first electrode 272 may be further arranged on the first electrode 272.

The organic light emitting layer 274 is arranged on the first electrode 272. At this time, the organic light emitting layer 274 of the second embodiment of the present disclosure can be manufactured at a low temperature and a low cost by forming it by using the ink-jet printing method, other than a vapor evaporation method. At this time, the organic light emitting layer 274 may be arranged corresponding to the light emitting area AA on the substrate 210, but is not limited thereto.

The organic light emitting layer 274 may be formed of an organic light emitting material that outputs a white light. For example, the organic light emitting layer 274 may be formed of a blue organic light emitting layer, a red organic light emitting layer, and a green organic light emitting layer and may be formed as a tandem structure including the blue light emitting layer and a yellow-green light emitting layer. However, the organic light emitting layer 274 of the present disclosure is not limited to the above structure, and various structures may be applied.

Although not shown in the drawings, the OLED 270 may include an EIL and an HIL to inject an electron and a hole into the organic emission layer 274, an ETL and an HTL to transport the injected electron and hole to the organic light emitting layer, respectively, and an EML to emit a light between the ETL and the HTL.

The organic light emitting layer 174 is a material that emits a light in a visible light area by transporting the hole and the electron from the HTL and the ETL, respectively, and combining them, and a material having good quantum efficiency for a fluorescence or a phosphorescence is preferable. As the organic material, for example, 8-hydroxyquinoline aluminum complex (Alq3), a carbazol-based compound, a dimerized styryl compound, BAlq, 10-hydroxybenzo quinoline-metal compound, a benzoxazole, benzthiazol, and benzimidazole-based compound, poly-p-phenylenevinylene (PPV), etc., can be used, but is not limited thereto.

The second electrode 276 is arranged on the organic light emitting layer 274. The second electrode 276 may be formed of a metal such as Ca, Ba, Mg, Al, or Ag, or an alloy thereof.

At this time, when the first electrode 172 is an anode of the OLED 270, and the second electrode 276 is a cathode, and a voltage is applied to the first electrode 272 and the second electrode 276, an electron is injected from the second electrode 276 into the organic light emitting layer 274, and a hole is injected from the first electrode 272 into the organic light emitting layer 274 to form an exciton in the organic light emitting layer 174. As the exciton is decayed, a light corresponding to an energy difference between a lowest unoccupied molecular orbital (LOMO) and a highest occupied molecular orbital (HOMO) of the organic light emitting layer 174 is generated to emit a light.

In the OLED display device 200 in accordance with the second embodiment of the present disclosure, the protective layer 250 having the convex shaped protruding pattern 255 is arranged in a light emitting area AA at a central portion of the substrate 210, so that only the light emitting area AA has the selectively convex protruding shape.

Accordingly, in the OLED display device 200 in accordance with the second embodiment of the present disclosure, in the process of forming the organic light emitting layer 274 in the ink-jet printing method, the protruding pattern 255 of the protective layer 250 can artificially offset the organic light emitting layer 274 arranged at the central portion of the substrate 210 being sagged, by the protective layer 250 having the convex shaped protruding pattern 255 and can compensate for it. Therefore, it can improve the problem of thickness non-uniformity of the central portion and the edge portion of the substrate 210 due to the sagging phenomenon of the organic light emitting layer 274 arranged in the light emitting area AA disposed at the central portion of the substrate 210.

As a result, in the OLED display device 200 in accordance with the second embodiment of the present disclosure, although the organic light emitting layer 274 arranged in the light emitting area in the central portion of the substrate 210 is sagged in a downwardly convex form, the upwardly convex shaped protruding pattern 255 is arranged in the light emitting area AA. Accordingly, since it can offset the thickness that the organic light emitting layer 274 is sagged, and consequently, it is possible to uniformly secure the thickness of the organic light emitting layer 274 arranged in the light emitting area AA of the central portion and the edge portion of the substrate 210.

Therefore, since the OLED display device 200 in accordance with the first embodiment of the present disclosure exhibits a maximum thickness deviation of 10A or less between the organic light emitting layers 274 arranged at the central portion and the edge portion of the substrate 210, and has excellent thickness uniformity, there is no concern that an operating voltage increases, thereby improving light extraction efficiency and lifetime.

In addition, in the OLED display device 200 in accordance with the second embodiment of the present disclosure, since a protruding pattern 255 is formed simultaneously with the protective layer 250 by the selective etching process using the halftone mask when forming the protective layer 250, the protective layer 250 and the protruding pattern 255 have an integrated structure. Thereby, there is no need to use the separate mask, and thus, the manufacturing cost does not increase.

Figure 6:
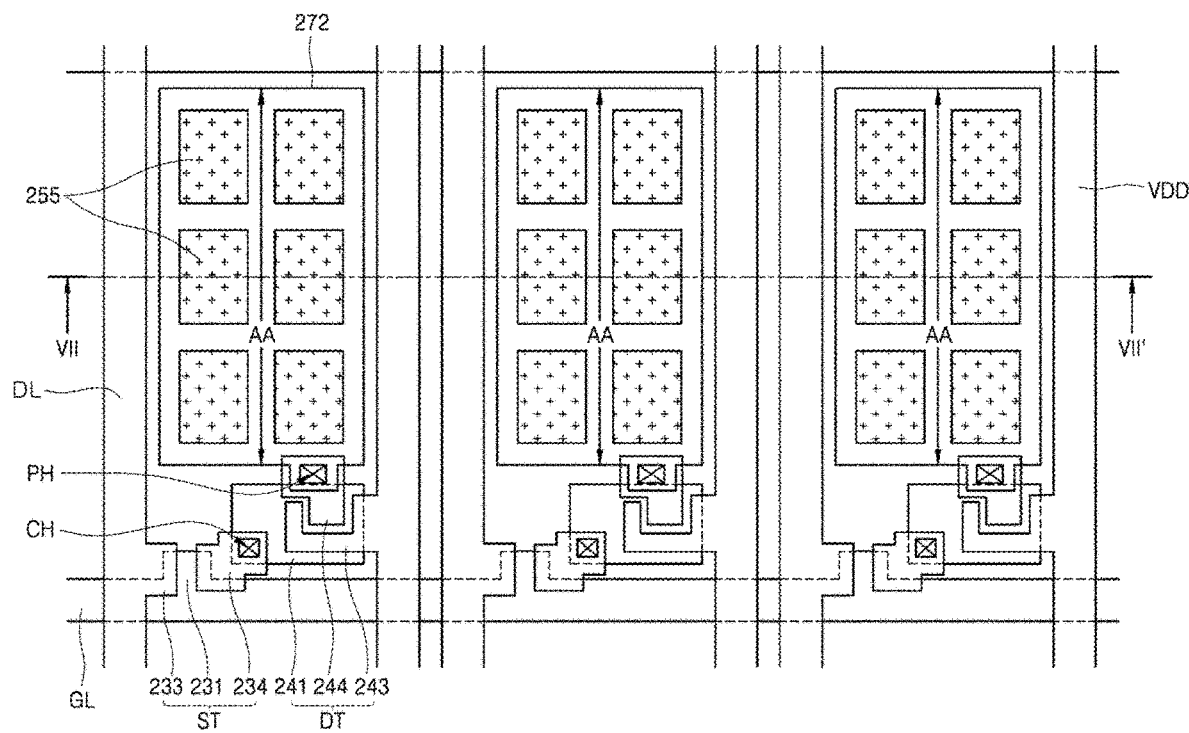
FIG. 6 is a plan view showing an OLED display device in accordance with a variation of a second embodiment of the present disclosure.
Figure 7:
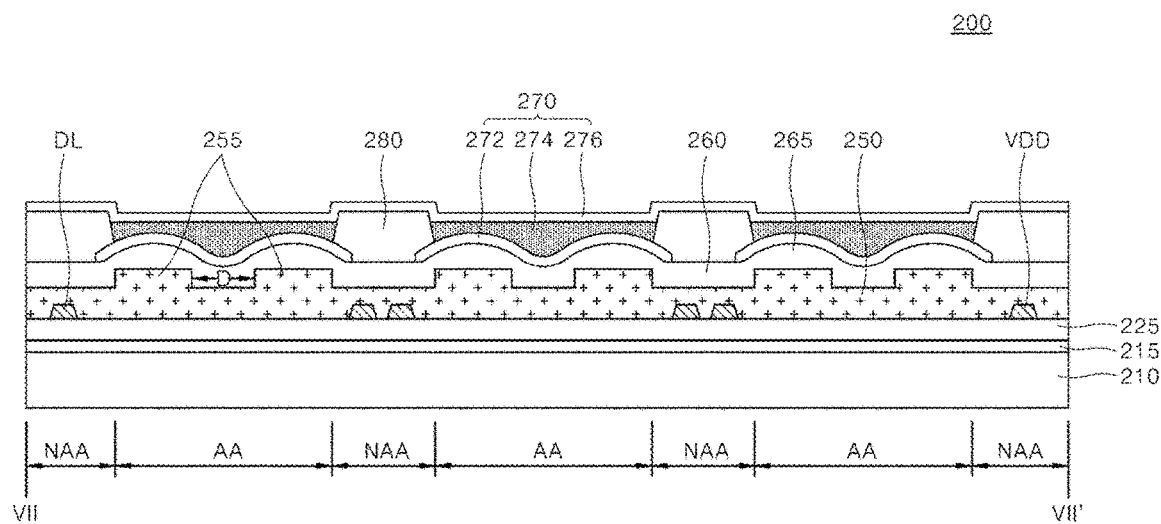
FIG. 7 is a cross-sectional view taken along line VII-VII' of FIG. 6, according to an embodiment of the present disclosure.

Meanwhile, FIG. 6 is a plan view showing an OLED display device in accordance with a variation of a second embodiment of the present disclosure, and FIG. 7 is a cross-sectional view showing by taken along line VII-VII' of FIG. 6. At this time, the OLED display device in accordance with a variation of the second embodiment of the present disclosure is substantially the same as the OLED display device according to the first embodiment except that it further includes a color filter in addition to an arrangement relationship of a protruding pattern, the overlapped description is omitted and only the difference will be mainly described.

Referring to FIGS. 6 and 7, in the OLED display device 200 in accordance with the variation of the second embodiment of the present disclosure, a protruding pattern 255 may be arranged in a form separated with at least two or more thereof respectively in a light emitting area AA, unlike the first embodiment.

At this time, in the case of the OLED display device 200 in accordance with the second embodiment shown and described in FIGS. 4 and 5, since it has a structure that the protruding pattern 255 is arranged in the light emitting area AA one by one, respectively, it is possible to secure a distance between the protruding patterns 255 arranged in a neighboring light emitting area AA and there is no concern that a moire defect is generated.

However, since the OLED display device 200 in accordance with the variation of the second embodiment of the present disclosure has a structure in which the protruding patterns 255, which are separated into at least two or more thereof are designed in the light emitting area AA having a predetermined area, as the number of a plurality of protruding patterns 255 increases, a distance D between them can be narrowed. As such, when the distance D between the protruding patterns 255 separated into a plurality thereof is too narrow, which is less than 10 μm, a diffraction of a light may be occurred to generate a moire phenomenon, which may lead to a poor image quality.

Therefore, it is preferable that the distance D between the plurality of protruding patterns 255 arranged in the light emitting area AA respectively is designed to be at least 10 μm or more, more preferably 10 to 2,000 μm, and most preferably 100 to 1,000 μm.

As described above, when the protruding patterns 255 separated into at least two or more thereof are arranged in a protective layer 250, a thickness control may be possible even in the light emitting area AA, so that a more accurate thickness uniformity than the second embodiment can be secured.

At this time, the protruding pattern 255 may have a rectangular shape viewed in a plan. In addition, the protruding pattern 255 may have any one shape of a triangular, a pentagon, a hexagon, and an octagon viewed in a plan.

In addition, although not shown in detail in the drawings, the OLED display device 200 in accordance with a variation of the second embodiment of the present disclosure may further include a color filter and an encapsulation layer.

The color filter may be arranged in a light emitting area AA between a protective layer 250 and an overcoat layer 260 and arranged so as to be overlapped with the organic light emitting layer 274. This color filter may be arranged one by one for each light emitting area AA. The color filter may include the red, green, and blue sub-color filters sequentially arranged, and may further include a white color filter.

The encapsulation layer may be arranged to cover a substrate 210 on which an OLED 270 is arranged. At this time, the encapsulation layer may include an adhesive layer and a base material layer arranged on the adhesive layer. As described above, an encapsulation layer including the adhesive layer and the base material layer is arranged on the substrate provided with the OLED, and the base material layer is attached by the adhesive layer, thereby sealing the OLED display device.

At this time, a photocurable adhesive or a thermosetting adhesive can be used as the adhesive layer. The base material layer is arranged to prevent moisture or air from penetrating from an outside, and any material can be used as long as it can perform such a function. For example, a polymer material such as Polyethyleneterephtalate (PET) may be applied, or a metal material such as aluminum foil, Fe—Ni alloy, Fe—Ni—Co alloy, or the like may be formed as a material of the base material layer.

As described above, the OLED display device 200 in accordance with the variation of the second embodiment of the present disclosure has the protective layer 250 having a convex shaped protruding pattern 250 separated into at least two or more thereof. Thereby, in a process of forming the organic light emitting layer 274 in an ink-jet printing method, a plurality of protruding patterns 255 can artificially offset the organic light emitting layer 274 arranged in a central portion of the substrate 210 being sagged and can accurately compensate for it.

As a result, the OLED display device 200 in accordance with the variation of the second embodiment of the present disclosure can improve a problem of thickness non-uniformity of the central portion and an edge portion of the substrate 210 more effectively due to a sagging phenomenon of the organic light emitting layer 274 arranged in the light emitting area AA disposed at the central portion of the substrate 210, by the protective layer 250 having the convex shaped protruding pattern 255 separated with at least two or more thereof.

Hereinafter, a method of manufacturing an OLED display device in accordance with a second embodiment of the present disclosure will be described with reference to the accompanying drawings.

FIGS. 8 to 11 are the process cross-sectional views showing a method of manufacturing an OLED display device in accordance with a second embodiment of the present disclosure.

Figure 8:
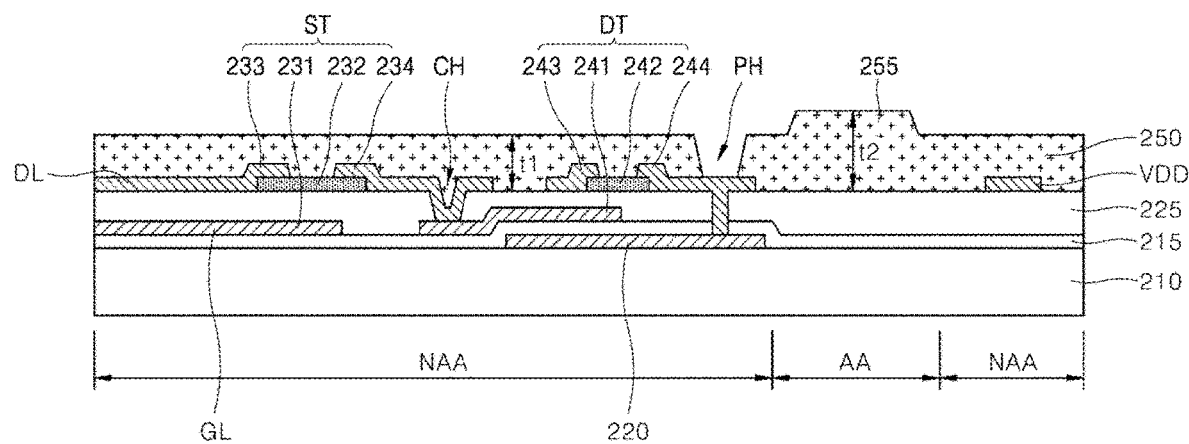
FIGS. 8 to 11 are the process cross-sectional views showing a method of manufacturing an OLED display device in accordance with a second embodiment of the present disclosure.

As shown in FIG. 8, after a metal layer is formed on a substrate 210, a selective patterning is performed to form a light blocking pattern 220. At this time, it is preferable that the light blocking pattern 220 is formed at a position overlapped with a semiconductor layer forming area of a driving transistor DT.

Next, a buffer layer 215 is formed on the substrate 210 on which the light blocking pattern 220 is formed. At this time, when an inorganic material such as SiOx or SiNx, etc., is used as the buffer layer 215, it may be formed by a sputtering deposition method. When an organic material such as PAC is used, it may be formed by coating by a spin coating method.

Next, a gate line GL, a data line DL, a driving current line VDD, and the thin film transistors ST and DT are formed on the buffer layer 215.

At this time, the thin film transistors ST and DT may include a switching transistor ST and a driving transistor DT.

The switching transistor ST includes a gate electrode 231 that is protruded from a gate line GL and a semiconductor layer 232 which is arranged with overlapped with the gate electrode 231 and a source electrode 233 that is protruded from a data line DL, and a drain electrode 234 arranged with spaced apart from the source electrode 233. In addition, the switching transistor ST may further include a gate insulating film 225 arranged between the gate electrode 231 and the semiconductor layer 232.

The driving transistor DT includes a gate electrode 241 connected to a drain electrode 234 of the switching transistor ST through a drain contact hole CH and a semiconductor layer 242 arranged at an upper portion overlapped with the gate electrode 241, a source electrode 243 connected to a driving current line VDD, and a drain electrode 244 arranged with spaced apart from the source electrode 243. In addition, the driving transistor DT may further include a gate insulating film 225 arranged between the gate electrode 241 and the semiconductor layer 242.

Next, a protective layer 250 having a protruding pattern 255 is formed on the substrate 210 on which the switching transistor ST and the driving transistor DT are formed. Then, a portion of the protective layer 250 having the protruding pattern 255 is selectively removed to form a pixel contact hole PH to expose the drain electrode 234 of the driving transistor DT.

At this time, the protruding pattern 255 is formed by a selective etching process using a halftone mask when the protective layer 250 is formed. That is, when the protective layer 250 is formed, after a photosensitive layer is formed on the substrate 210, a halftone mask (not shown) having a semi-transparent area arranged at a position corresponding to a light-emitting area AA on an upper portion of the photosensitive layer, a transparent area arranged at a position corresponding to the pixel contact hole PH, and a transparent area arranged at a position corresponding to a non-light emitting area AA. Then, the protective layer 250 having the protruding pattern 255 can be formed by performing the selective exposure and etching.

As described above, since the protruding pattern 255 is formed simultaneously with the protective layer 250, the protruding pattern 255 and the protective layer 250 have an integrated structure. Thereby, there is no need to further use a separate mask, and thus, a manufacturing cost does not increase.

The protective layer 250 may be formed of an inorganic layer such as SiOx, SiON, SiNx, or the like. In addition, the protective layer 250 may be formed of an organic layer such as photoacryl, and may be formed of a plurality of layers including an inorganic layer and an organic layer.

As described above, the protective layer 250 having a convex shaped protruding pattern 255 is arranged in the light emitting area AA at the central portion of the substrate 210, so that only the light emitting area AA has a selectively convex protruding shape.

Figure 9:
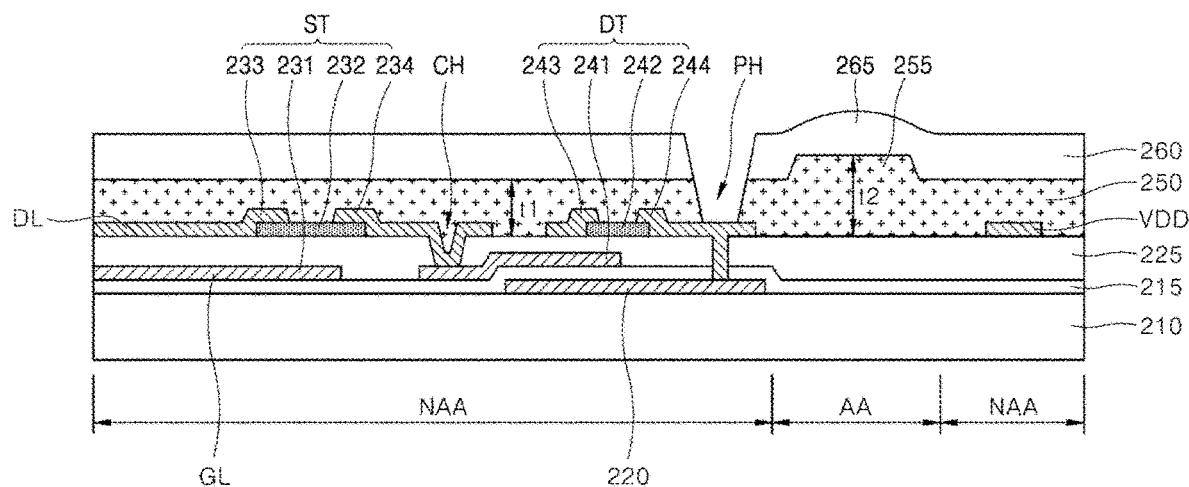

As shown in FIG. 9, an organic material including photo acrylic (PAC) is coated on a protective layer 250 on which a pixel contact hole PH is formed and dried to form an overcoat layer 260. At this time, it is preferable that the overcoat layer 260 is formed on an entire surface of a protective layer 250 except a pixel contact hole PH. The overcoat layer 260 serves to block moisture and air penetrating from a lower portion of the substrate 210 in addition to flattening a surface of a substrate 210.

In this step, the overcoat layer 260 is formed on the protective layer 250 having a protruding pattern 255 so that the overcoat layer 260 has a convex shaped protrusion 265 at a position corresponding to the protruding pattern 255. It is preferable that the protrusion 265 of the overcoat layer 260 has the thickness of 60 Å or less. This is because, when the protrusion 265 of the overcoat layer 260 is designed to have a thickness exceeding 60 Å, an excessive thickness design may lead to a defect that is protruded in an upwardly convex from after vacuum drying and annealing.

Figure 10:
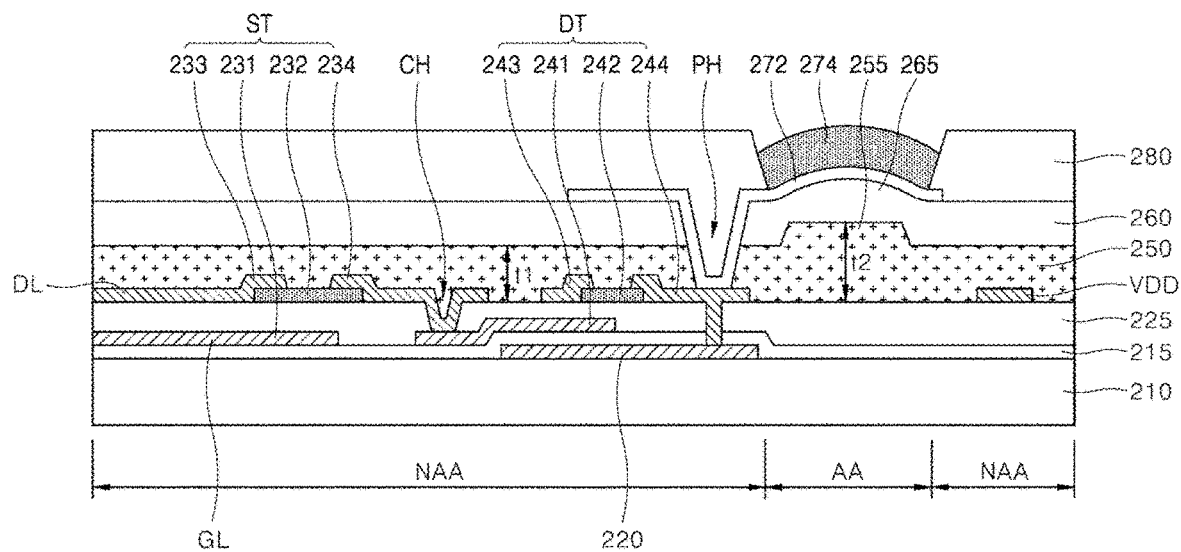

As shown in FIG. 10, after a transparent conductive material such as ITO is deposited on an overcoat layer 260 and is selectively patterned to form a first electrode 272, a bank layer 280 is formed at a non-light emitting area NAA on a first electrode 272. At this time, a drain electrode 244 of a driving transistor DT is electrically connected to the first electrode 272 of an OLED 270 through a pixel contact hole PH. Here, a portion of the first electrode 272 is exposed to the outside by the bank layer 280.

Next, an organic light emitting layer 274 is formed in a light emitting area AA on the first electrode 272 exposed by the bank layer 280 by an ink-jet printing method.

At this time, the organic light emitting layer 274 is manufactured by printing each material of an HIL, an HTL, an EML, an ETL, and an EIL in air by the ink-jet printing method, vacuum drying, and annealing in air or nitrogen atmosphere.

In this step, in a process of forming the organic light emitting layer 274 in the ink-jet printing method, the protruding pattern 255 of the protective layer 250 can artificially offset the organic light emitting layer 274 arranged at a central portion of a substrate 210 being sagged, by a protective layer 250 having a convex shaped protruding pattern 255 and can compensate for it. Therefore, it can improve a problem of thickness non-uniformity of the central portion and an edge portion of the substrate 210 due to a sagging phenomenon of the organic light emitting layer 274 arranged in the light emitting area AA disposed at the central portion of the substrate 210.

Accordingly, although the organic light emitting layer 274 arranged in the light emitting area AA in the central portion of the substrate 210 is sagged in a downwardly convex form, an upwardly convex shaped protruding pattern 255 is arranged in the light emitting area AA. Accordingly, it can offset the thickness that the organic light emitting layer 274 is sagged, and consequently, it is possible to uniformly secure the thickness of the organic light emitting layer 274 arranged in the light emitting area AA of the central portion and the edge portion of the substrate 210.

Figure 11:
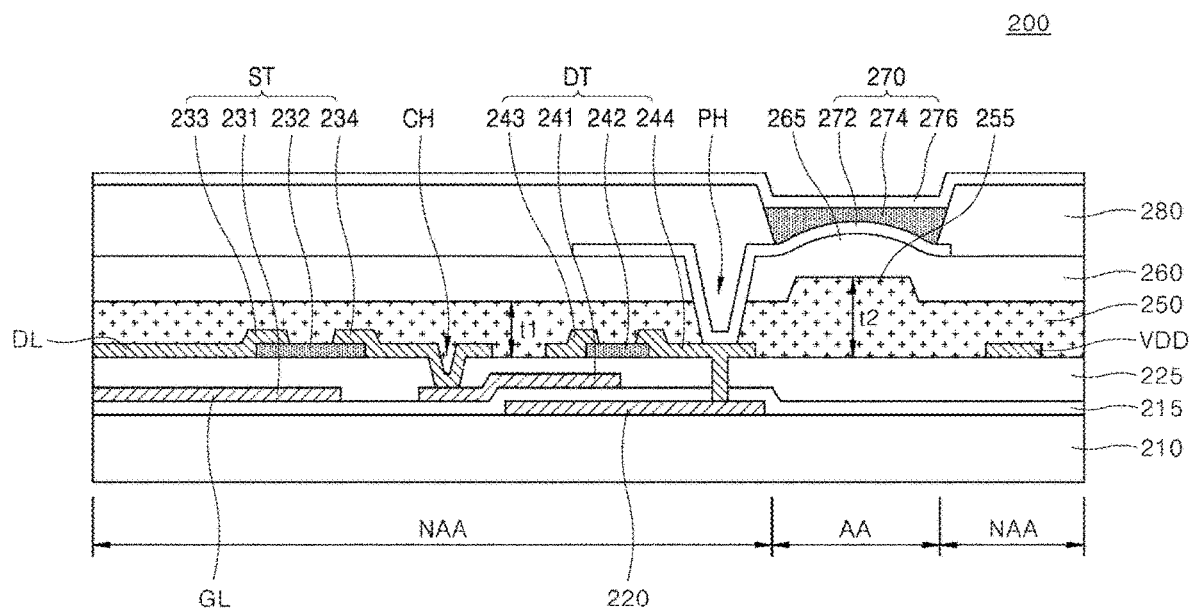

As shown in FIG. 11, at least one selected from a metal such as Ca, Ba, Mg, Al, and Ag or an alloy thereof is deposited on an organic light emitting layer 274 and a bank layer 280 to form a second electrode 276.

Thus, the OLED display device in accordance with the second embodiment of the present disclosure can be manufactured.

Figure 12:
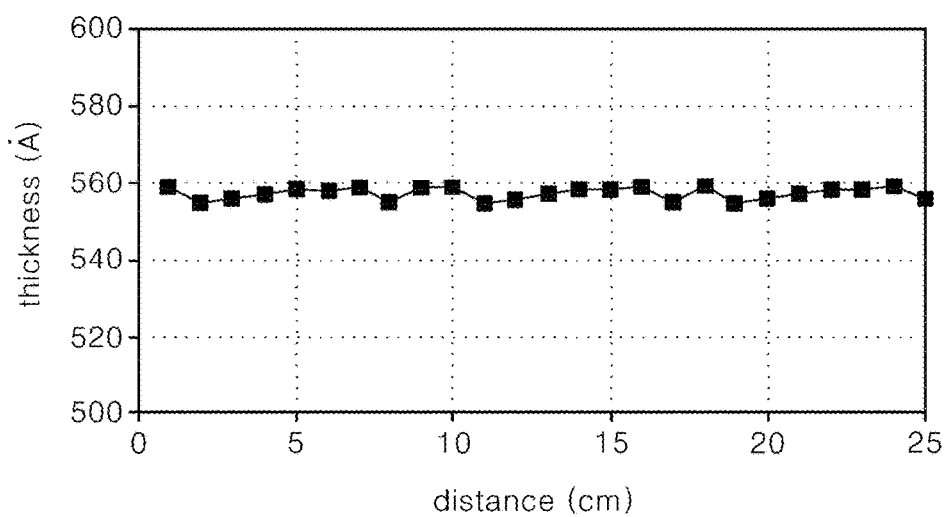
FIG. 12 is a graph showing a result of thickness measurement depending on a distance of an OLED of an OLED display device in accordance with a second embodiment of the present disclosure.

Meanwhile, FIG. 12 is a graph showing a result of thickness measurement of an OLED of an OLED display device in accordance with a second embodiment of the present disclosure.

As shown in FIG. 12, in the case of the OLED display device in accordance with the second embodiment of the present disclosure, it can be confirmed that a thickness deviation between an organic light emitting layer arranged at a central portion of a substrate and an organic light emitting layer arranged at an edge portion of a substrate hardly occurs.

At this time, the maximum deviation between the organic light emitting layers arranged at the center portion and the edge portion of the substrate respectively was measured to be about 8 Å, and it is confirmed that the thickness of the organic light emitting layer arranged in an entire area of the substrate is uniformly arranged.

Figure 13A:
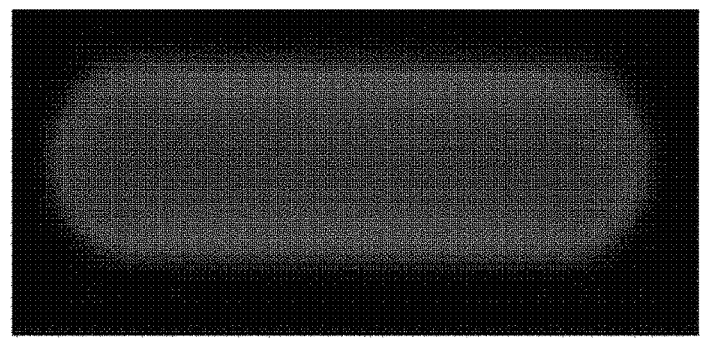
FIGS. 13A and 13B are SEM photographs showing by photographing an OLED of an OLED display device in accordance with the first and second embodiments of the present disclosure.
Figure 13B:
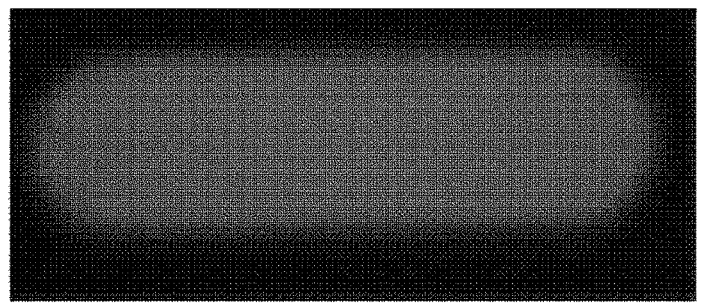

FIG. 13 is an SEM photograph showing by photographing an OLED of an OLED display device in accordance with the first and second embodiments of the present disclosure. At this time, FIG. 13A is the SEM photograph of the OLED display device in accordance with the first embodiment and FIG. 13B is the SEM photograph of the OLED display device in accordance with the second embodiment.

As shown in FIG. 13, in the case of the display device in accordance with the second embodiment, as the maximum thickness deviation between the organic light emitting layers arranged at a central portion and an edge portion of a substrate has an excellent thickness uniformity of about 8 Å, it can be confirmed that both central portion and edge portion show a clear image.

On the other hand, in the case of the display device according to Example 1, since the maximum thickness deviation between an organic light emitting layer arranged at a central portion and an edge portion of a substrate is about 67 Å, which a thickness uniformity is not good, it can be confirmed that an image in the central portion of the substrate is shown as dark compared to an image in the edge portion of the substrate.

While the embodiments of the present disclosure have been mainly described hereinabove, various modifications and changes can be made within a level of those skilled in the art. It is therefore to be understood that such modifications and changes are included within the scope of the present disclosure unless the modifications and changes do not depart from the scope of the present disclosure.

What is claimed is:

1. An organic light-emitting diode (OLED) display device, comprising:
    a substrate having a light emitting area and a non-light emitting area;
    a thin film transistor arranged on the substrate;
    a protective layer that covers the light emitting area and the non-light emitting area and has a protruding pattern arranged only in the light emitting area;
    an overcoat layer that covers the protective layer;
    a first electrode that is arranged on the overcoat layer and is connected to the thin film transistor through a first contact hole to expose a part of the protective layer and the overcoat layer, and overlapped with the protruding pattern;
    an organic light emitting layer that is arranged on the first electrode; and
    a second electrode that is arranged on the organic light emitting layer,
    wherein a top surface of the first electrode has a convex shape, and
    wherein a top surface of the organic light emitting layer has a flat shape,
    wherein the protective layer is formed of an inorganic layer,
    wherein the overcoat layer is formed of an organic layer, and
    wherein the protective layer arranged in the non-light emitting area of the substrate has a first thickness, and the protective layer arranged in the light emitting area of the substrate has a second thickness by the protruding pattern, and the second thickness is thicker than the first thickness.

2. The OLED display device of claim 1, wherein the protruding pattern has an integrated structure with the protective layer.

3. The OLED display device of claim 1, wherein the protruding pattern has any one shape of a circle, a triangle, a rectangle, a pentagon, a hexagon, and an octagon when viewed in a plane.

4. The OLED display device of claim 1, wherein the protruding pattern is arranged to correspond to the light emitting area one by one, respectively.

5. The OLED display device of claim 1, wherein the protruding pattern is arranged in a form separated with at least two or more thereof respectively on the light emitting area.

6. The OLED display device of claim 5, wherein the separated protruding patterns are arranged spaced apart from each other by a distance of 10 μmor more.

7. The OLED display device of claim 1, wherein the overcoat layer has a convex shaped protrusion at a position corresponding to the protruding pattern.

8. The OLED display device of claim 7, wherein the protrusion of the overcoat layer has a thickness of 60 Å or less.

9. The OLED display device of claim 1, wherein a maximum thickness deviation of the organic light emitting layer arranged at a central portion and an edge portion of the substrate is 10 Å or less.

10. The OLED display device of claim 1, further comprising a color filter that is arranged in a light emitting area between the protective layer and the overcoat layer, respectively, and is arranged to be overlapped with the organic light emitting layer.

11. The OLED display device of claim 1, wherein the organic light emitting layer is formed by an ink-jet printing method.

12. The OLED display device of claim 1, wherein a thickness between the first electrode and the second electrode at a central portion of the organic light emitting layer is smaller than a thickness between the first electrode and the second electrode at an edge portion of the organic light emitting layer.

* * * * *